(12) United States Patent
Gerst et al.

(10) Patent No.: US 9,606,575 B2
(45) Date of Patent: Mar. 28, 2017

(54) HOUSING WITH RELEASABLE LOCKING ELEMENT

(71) Applicants: KONINKLIJKE PHILIPS N.V., Eindhoven (NL); PHILIPS DEUTSCHLAND GMBH, Hamburg (DE)

(72) Inventors: Kaljopa Gerst, Altdorf (DE); Frank Werner, Ammerbuch (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 12 days.

(21) Appl. No.: 14/432,493

(22) PCT Filed: Sep. 10, 2013

(86) PCT No.: PCT/IB2013/058414
§ 371 (c)(1),
(2) Date: Mar. 31, 2015

(87) PCT Pub. No.: WO2014/053926
PCT Pub. Date: Apr. 10, 2014

(65) Prior Publication Data
US 2015/0277487 A1 Oct. 1, 2015

Related U.S. Application Data

(60) Provisional application No. 61/708,725, filed on Oct. 2, 2012.

(51) Int. Cl.
*G06F 1/06* (2006.01)
*H05K 5/00* (2006.01)
(Continued)

(52) U.S. Cl.
CPC .......... *G06F 1/1601* (2013.01); *G06F 1/1626* (2013.01); *H05K 5/0013* (2013.01); *H05K 5/0017* (2013.01); *H05K 5/0221* (2013.01)

(58) Field of Classification Search
CPC .... G06F 1/1613; G06F 1/1626; G06F 1/1628; G06F 1/1633; G06F 1/1656;
(Continued)

(56) References Cited

U.S. PATENT DOCUMENTS

| 4,077,515 A | 3/1978 | Shoberg |
| 6,440,076 B1 | 8/2002 | Sudol et al. |

(Continued)

FOREIGN PATENT DOCUMENTS

| WO | 9519594 A1 | 7/1995 |
| WO | 2012063160 A1 | 5/2012 |

*Primary Examiner* — Anthony Haughton
*Assistant Examiner* — Ingrid Wright

(57) ABSTRACT

The present invention relates to a housing (10) with at least one first and at least one second housing part (14, 16) and at least one locking element (26), the latter being arranged movably on the at least one first housing part (14) and comprises a plurality of first engaging portions (28, 30, 32, 34) that form a releasable fit connection with a plurality of second engaging portions (44, 46, 48, 50) arranged on the second housing part. The change between the engaged and a disengaged state of the first and second engaging portions is realized by moving the locking element (26). The invention relates further to a monitor device with such a housing (10).

20 Claims, 8 Drawing Sheets

(51) Int. Cl.
*H05K 5/02* (2006.01)
*G06F 1/16* (2006.01)

(58) Field of Classification Search
CPC ........ G06F 1/1679; G06F 1/1601; G06F 1/16;
G06F 1/181; G06F 1/203; G06F 1/1637;
G06F 1/1643; H05K 5/0004; H05K
5/0017; H05K 5/0013; H05K 5/0221;
H05K 5/0239; H05K 5/03; H05K 5/02;
H05K 5/0217; H05K 5/00
USPC ......... 361/679.55–679.58, 724–727, 679.02,
361/679.26, 679.27, 679.09, 679.21,
361/679.01
See application file for complete search history.

(56) References Cited

U.S. PATENT DOCUMENTS

| | | | |
|---|---|---|---|
| 7,272,011 B2* | 9/2007 | Chen | G06F 1/181 361/726 |
| 7,349,199 B2* | 3/2008 | Tracy | G06F 1/1616 248/615 |
| 7,924,553 B2* | 4/2011 | Lev | G06F 1/1616 248/921 |
| 8,074,390 B2 | 12/2011 | Rain | |
| 2006/0274493 A1 | 12/2006 | Richardson et al. | |
| 2010/0270050 A1 | 10/2010 | Wang et al. | |
| 2010/0320221 A1 | 12/2010 | Chang | |
| 2011/0054268 A1 | 3/2011 | Fidacaro et al. | |

\* cited by examiner

HOUSING WITH RELEASABLE LOCKING ELEMENT

CROSS REFERENCE TO RELATED APPLICATIONS

This application is a national filing of PCT application Serial No. PCT/IB2013/058414, filed Sep. 10, 2013, published as WO 2014/053926 A1 on Apr. 10, 2014, which claims the benefit of U.S. provisional application Ser. No. 61/708,725 filed Oct. 2, 2012, which is incorporated herein by reference.

FIELD OF THE INVENTION

The present invention relates to a housing, especially a housing for a patient monitor, comprising at least two housing parts and at least one locking element being arranged movably on the at least one first housing part and comprising a plurality of first engaging portions interacting with second engaging portions on the at least one second housing part by moving the at least one locking element. Further, the inventions relates to a monitor device with such a housing.

BACKGROUND OF THE INVENTION

Common locking elements used for housings comprise one or more pairs of matching engaging portions wherein each one of the two engaging portions is arranged on one part of the housing. These matching engaging portions are arranged on these housing parts such that they can be brought into an engaged state with respect to each other when the housing parts are put together. This can be realized by a separate mechanism that has to be actuated for every locking mechanism individually, for example if the two engaging portions are realized by a screw and a hole, or may be realized by at least one of the engaging portions being biased such that the engaged state is achieved by one engaging portion latching into or behind the other.

Using screws as the locking mechanism often results in an uneven fixation of the different housing parts and provides further entry points through which liquids or other unwanted fluids can enter the inside of the housing, for example in the areas where the screws are accessible from the outside. Housings with the afore-mentioned latching mechanisms on the other hand are difficult to disassemble, such that a maintenance of the device within the housing is time-consuming and results often in unwanted and unacceptable damages of the outer housing surfaces.

SUMMARY OF THE INVENTION

It is an object of the present invention to provide a housing, and a monitor device with such a housing, being comprised of at least two housing parts that can be releasably arranged at one another in a way such that the whole housing does not provide unwanted openings for liquids or other fluids and can further be disassembled very easily.

In an aspect of the present invention a housing is provided with
at least one first housing part, having a first inner wall,
at least one second housing part, having a second inner wall, and
at least one locking element,
wherein the at least one locking element is arranged movably on the at least one first housing part along at least one path and comprises a plurality of first engaging portions,
wherein the at least one second housing part comprises a plurality of second engaging portions on the second inner wall,
wherein each one of the first engaging portions forms a releasable fit connection with one corresponding second engaging portion that can at least be changed between an engaged and a disengaged state, and
wherein the change between these at least two states is realized for all the first engaging portions on a locking element and the corresponding second engaging portions simultaneously by moving the respective locking element along the at least one path.

In another aspect of the present invention a monitor device, preferably a patient monitor, is provided, with
a display for presenting information, and
a housing according to the present invention.

By moving the locking element the respective pairs of corresponding first and second engaging portions can be brought into the engaged state (or brought into the disengaged state) by just one actuation. Thereby, an evenly closed state can be achieved. Further, by providing the first and second engaging portions in the inside of the housing, that is to say on the inner walls of the at least one first and second housing parts, an opening for accessing every pair of first and second engaging portions is not necessary. If necessary at all, the locking element can be actuated via just one opening in the housing. Aside from this exemplary embodiment, other actuation methods that work through the housing without the need for a direct access are of course possible, like magnetic or electronically controlled actuation. Due to the absence of several openings for every pair of the engaging portions and the absence of an uneven closure of the at least two housing parts with each other, a smooth and securely closed housing is provided. Aside from positive influence on the design of the whole housing, the absence of these openings and locking elements being seen from the outside provides a housing that is tight with respect to fluids, like water, cleaning agents or also gases. This is especially beneficial if the device undergoes regular cleaning processes which occur frequently in the medical field and the medical devices, such as monitor devices like patient monitors. Also, by actuating several engaging portions simultaneously and thereby providing the engaged or disengaged state with just one actuation, a fast assembly or disassembly of the housing is possible. Accordingly, the housing can be re-opened and closed again relatively easy and fast, for example in cases where maintenance and/or repairs shall be carried out. Also, this leads to a faster manufacturing process of the devices, e.g. the monitor devices, using such a housing which further leads to a reduction of the overall costs for manufacturing the respective devices.

Preferred embodiments of the invention are defined in the dependent claims.

According to an embodiment of the housing, the at least one path leads to a translational movement of the at least one locking element. By such a design the actuation, and therefore the establishment of the engaged and the disengaged state is realized by moving the locking element along a longitudinal path, which can be either straight or may also comprise a curved shape. Accordingly, the realization of the engaged and the disengaged state can be done via a push and pull movement, for example.

According to another embodiment of the housing, the at least one path leads to a rotational movement of the at least one locking element. Such a locking element is preferably arranged in the respective housing part movably around a rotational axis. Such an arrangement can be realized in a very compact way and does not need much space for the open and close procedure, i.e. the engagement and disengagement.

According to another embodiment of the housing the housing comprises a plurality of locking elements, preferably two to four locking elements, and more preferably four, three or two locking elements. With a plurality of locking elements, for example two locking elements, it is easily possible to realize this locking mechanism of the present invention in different areas or on different sites of the housing. Thereby, the whole housing can be closed and securely locked by the actuation of just two locking elements instead of using ten screws, for example. Depending on the design of the housing, its size and the purpose of the housing, the amounts of locking elements may preferably be chosen as two, three or four locking elements in order to achieve a housing that is sealed and closed in an optimal way for the desired purpose.

According to another embodiment of the housing, the locking elements are arranged on opposing sides of the housing. By such an arrangement the locking of the at least two housing parts on each other can be realized in an easy and even way. By using opposing sides the distribution of the force acting via the locking mechanism on the two housing parts is also even.

According to another embodiment of the housing, the at least one locking element comprises a handle for moving the at least one locking element along the at least one path. The provision of at least one handle aids in the actuation of the locking element. In this way the locking element can be arranged in a place that is difficult to access and can still be easily actuated either by push and pull or via sliding movements of the handle. In this way it is possible that based on the general principle of the present locking mechanism according to the present invention an actuation of the whole locking mechanism occurs at one place that might be easily accessible via the handle, wherein the locking itself occurs at several other positions by bringing the first and second engaging portions into the engaged state. These other positions may also be at places that are harder to access, meaning that these other positions may be chosen such that the locking is optimal without the need to consider the accessibility of these other positions.

According to another embodiment of the housing, the housing further comprises
  at least one third engaging portion on the first inner wall of said first housing part, and
  at least one fourth engaging portion on the second inner wall of said second housing part,
  wherein the at least one third engaging portion and the at least one fourth engaging portion form a releasable fit connection that is established by joining the first housing part with the second housing part. Providing these third and fourth engaging portions equips the whole housing with another locking mechanism. This locking mechanism is realized by joining the first and second housing part with one another. For this, this locking mechanism, i.e. the third and fourth engaging portions are preferably arranged on one side of the housing. The assembly of the whole housing can then be realized by joining these third and fourth engaging portions with each other leading to already a locked state in the area where the third and fourth engaging portions are arranged. Thereafter, the first and second engaging portions are locked by the actuation of the at least one locking element as mentioned before. Thereby, the locking along at least one side of the housing does not need a separate actuation and can be realized in the assembly process of the two housing parts with each other.

BRIEF DESCRIPTION OF THE DRAWINGS

These and other aspects of the invention will be apparent from and elucidated with reference to the embodiment(s) described hereinafter. In the following drawings

DETAILED DESCRIPTION OF THE INVENTION

Figure 1:
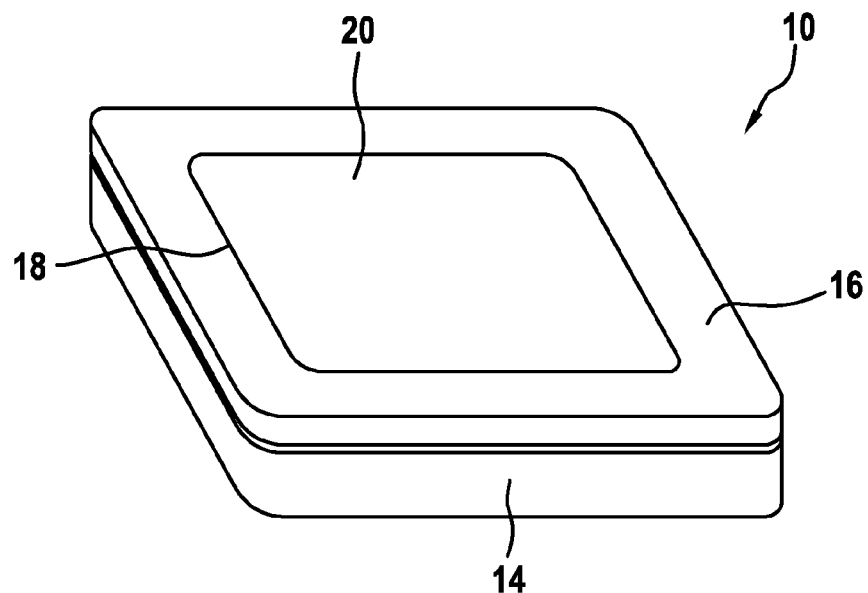
FIG. 1 shows a schematic perspective view of a housing of one embodiment according to the present invention.
Figure 2:
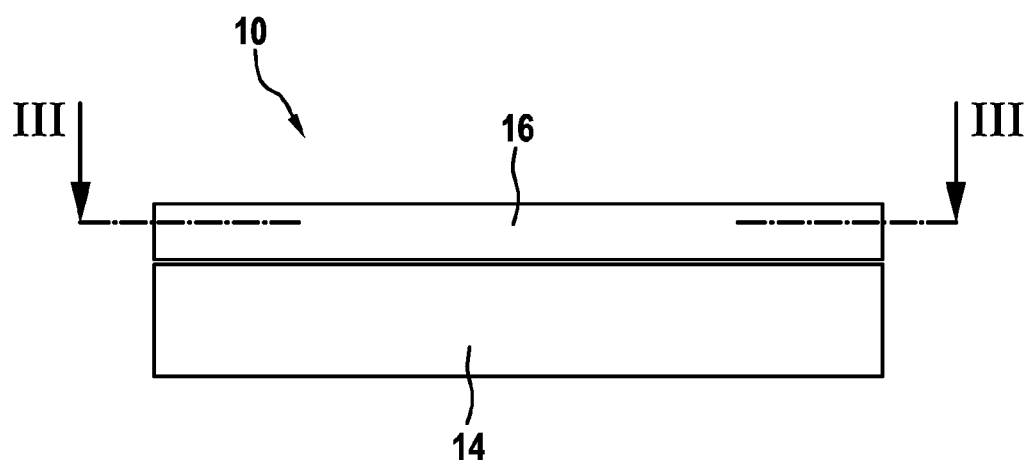
FIG. 2 shows the housing of FIG. 1 in a side view.

Embodiments of a housing according to the present invention are shown throughout and described with the help of FIGS. 1 to 10 and are designated in their entirety by the reference numerals 10 and 12.

The housing 10 shown in FIGS. 1 through 5 comprises a first housing part 14 and a second housing part 16. In this exemplary embodiment housing 10 is a housing for a patient monitor. Therefore, housing 10 further comprises an opening 18. This opening 18 may accommodate a display 20. Via this display 20 patient-relevant data, like but not limited to pulse, blood pressure, oxygen saturation of the blood, EKG- or EEG-data etc., may be displayed to the medical personal or a user in general. Accordingly, housing 10 may be used for a patient monitor device (now shown).

In this embodiment of housing 10, first housing part 14 and second housing part 16 are held together via two locking mechanisms 24 and 24'. These locking mechanisms comprise basically the same elements, but are arranged on opposing sides. However, the explanations that follow for and in the context of locking mechanism 24 are correspondingly valid for the locking mechanism 24' shown in the respective figures. Correspondingly, the same reference numerals are used for identical features only altered by an added prime (') after a reference numeral for clarity reasons.

The locking mechanism 24 comprises a locking element 26 which has in this embodiment four first engaging portions 28, 30, 32 and 34 arranged thereon. Locking element 26 is arranged on the first housing part 14. In this embodiment, the locking element 26 is designed as a rigid element. For arranging the locking element 26 on the first housing part 14 an attaching element 36 is provided. In this embodiment the attaching element 36 comprises holders 38 for holding the locking element 26 between these holders 38 and a first inner wall 40 of first housing part 14. For keeping the attaching elements 36 on the inner wall 40 of first housing part 14 screws 42 are provided for attaching the attaching elements 36. It goes without saying that aside from screws 42 other suitable attaching means may be used for attaching the attaching elements 36 to the first housing part 14, like but not limited to rivets, glue, latching mechanisms etc. As a result of this arrangement, the locking element 26 forms an integral part of the first housing part 14.

For attaching the second housing part 16 on the first housing part 14 second engaging portions 44, 46, 48 and 50 are arranged on an inner wall 52 of the second housing part 16, which will be explained in more detail later on.

Figure 3:
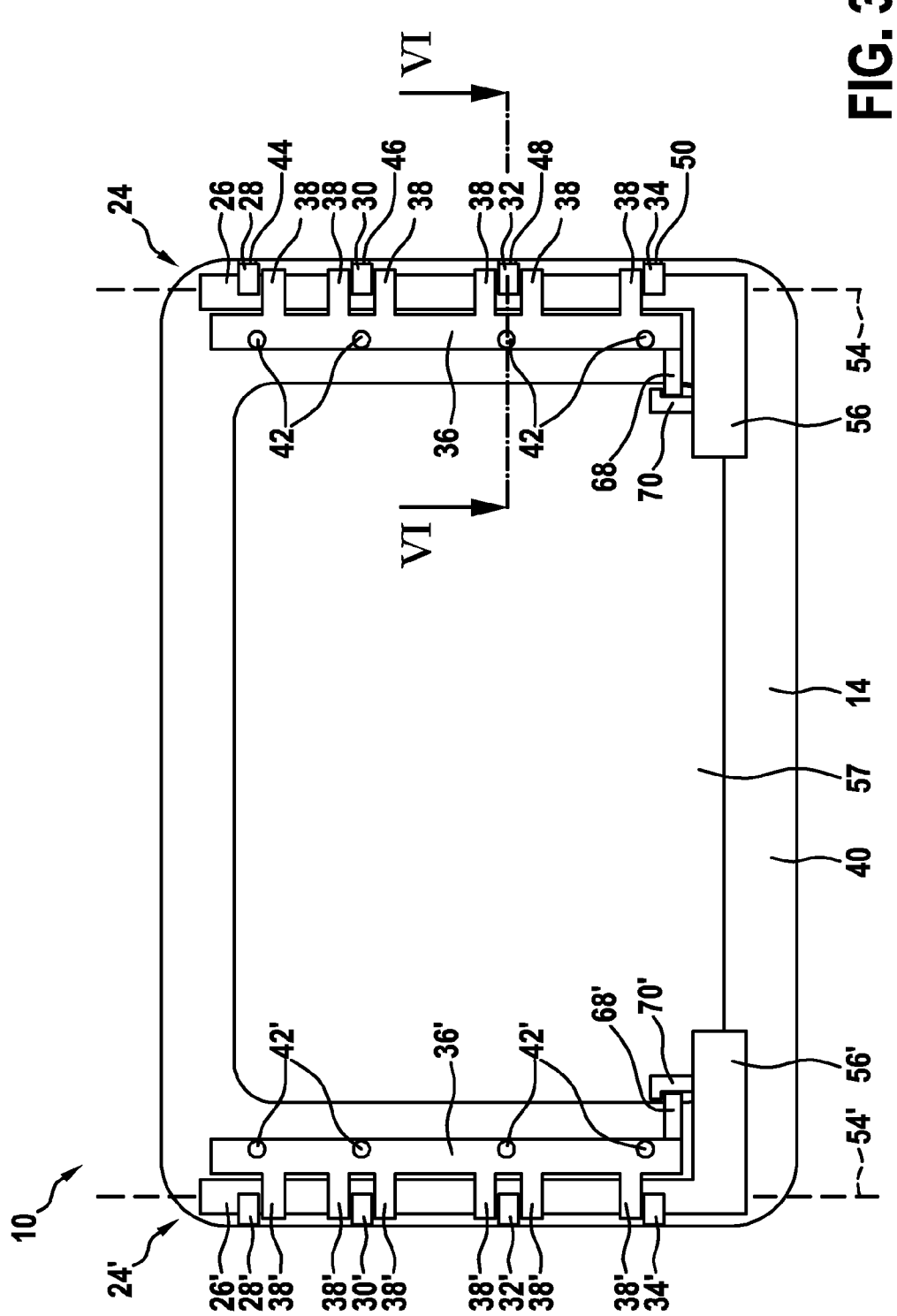
FIG. 3 shows a partly sectional view according to line III-III of FIG. 2 and therefore the inside of the housing of FIG. 1.
Figure 4:
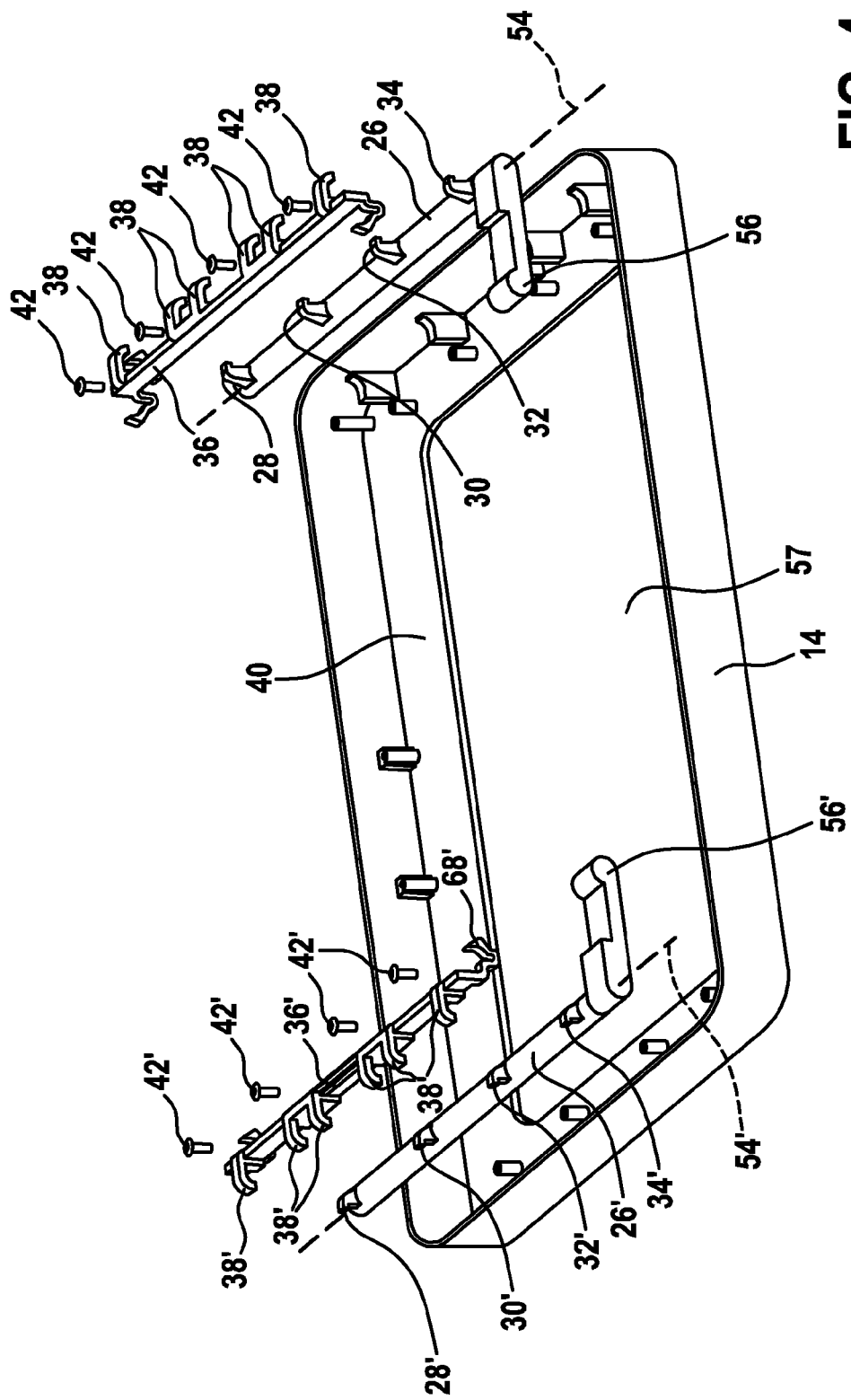
FIG. 4 shows an exploded view of a first housing part of the housing of FIG. 1 and an embodiment of the locking mechanism according to the present invention.
Figure 5:
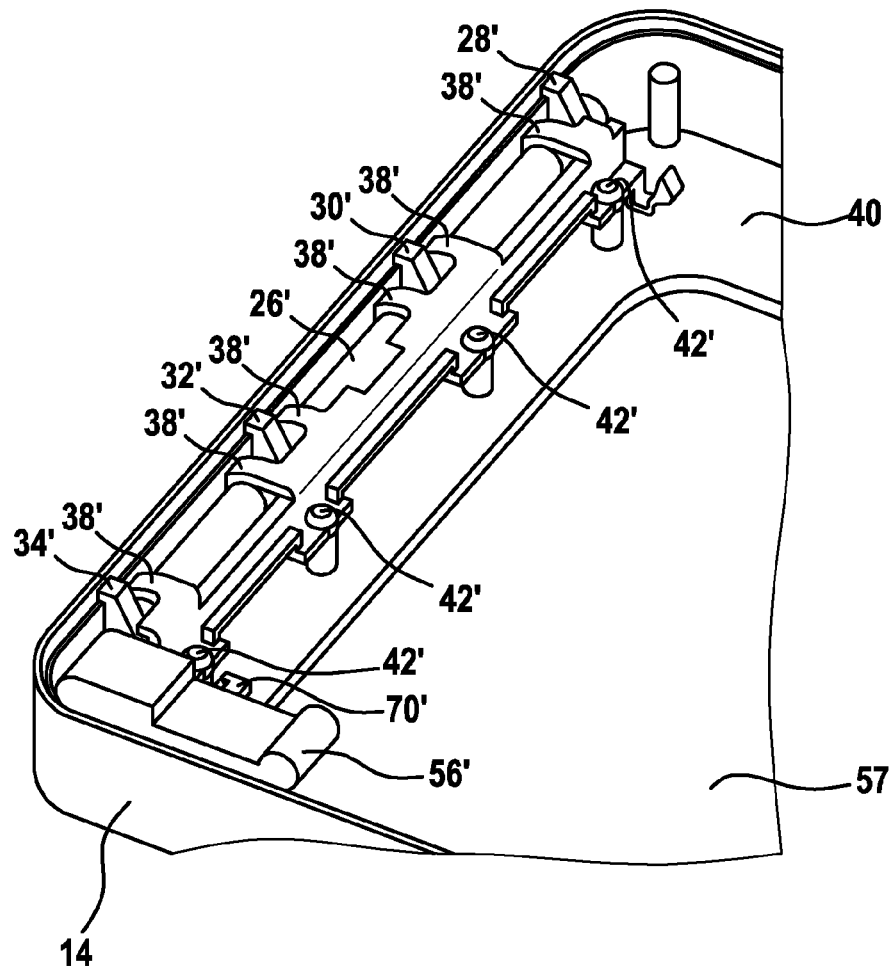
FIG. 5 shows a partly schematic perspective view of the locking mechanism with the first housing part of FIG. 4 in an assembled state.

In order to bring first engaging portions 28, 30, 32, 34 and second engaging portions 44, 46, 48, 50 in an engaged or disengaged state with each other, the locking element 26 is arranged rotatable on the first housing part 14. This rotation occurs along a rotating or pivot axis 54 as indicated in FIG. 3. Via movement around this pivot axis 54 the locking element 26 undergoes a rotational movement along a predefined path. In order to easily actuate the locking element 26 a handle 56 is provided on the locking element 26.

The first housing part 14 also comprises an opening 57. Via this opening 57 the first housing part 14, and thereby the complete housing 10 may be attached to other devices, like a main unit (not shown) to which an exemplary patient monitor device belongs. Via this opening 57 the handle 56 may be easily accessible. However, other (small) openings may be provided in at least one of the sides of housing 10 in order to provide access to handle 56, especially in the absence of opening 57. Also, other ways of actuation may be used, like but not limited to magnetic or electronically controlled mechanisms, that do not need a direct access to handle 56.

Figure 6:
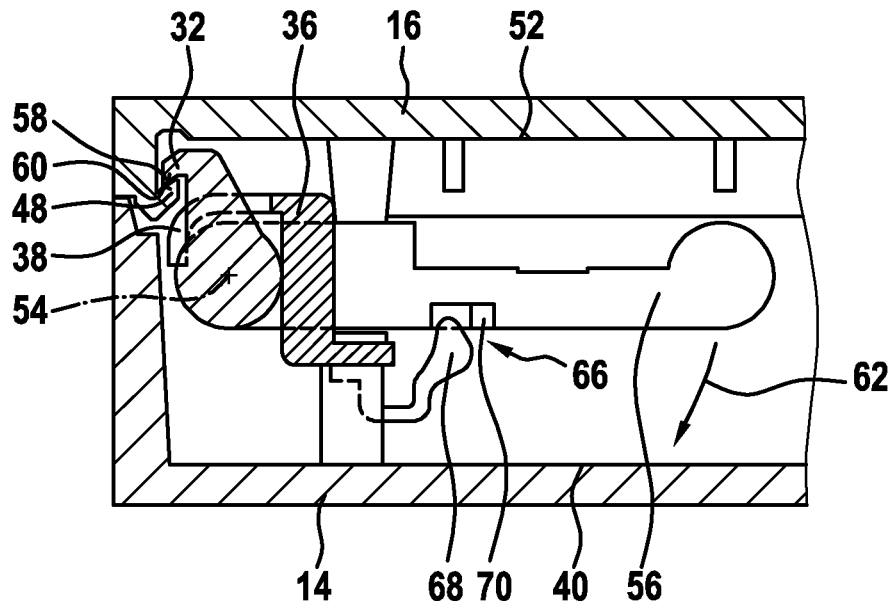
FIG. 6 shows an enlarged schematic sectional view according to line VI-VI of FIG. 3 showing the locking mechanism in the locked or engaged state.
Figure 7:
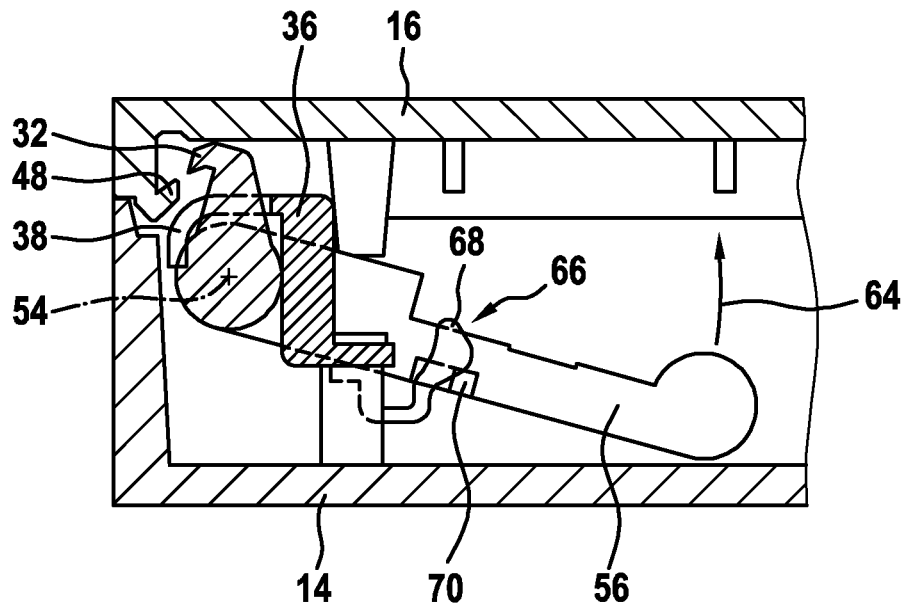
FIG. 7 shows the locking mechanism of FIG. 6 in an unlocked or disengaged state.

The functioning of the locking mechanism 24 shall be explained and illustrated in more detail by the detailed sectional views in FIGS. 6 and 7.

FIG. 6 shows the locked or engaged state of the locking mechanism 24 wherein the first engaging portion 32 is in a releasable fit connection with the second engaging portion 48. Even though in these exemplary explanations reference is only made to first engaging portion 32 and second engaging portion 48. It goes without saying that by actuation of the locking mechanism 24, especially of the locking element 26, all first engaging portions 28, 30, 32 and 34 are actuated and thereby brought in the releasable fit connection, i.e. in the engaged state, with the corresponding second engaging portions 44, 46, 48 and 50, respectively. The same applies for the movement into or towards the disengaged state and out of the releasable fit connection of the mentioned first and second engaging portions.

The releasable fit connection between first engaging portion 32 and second engaging portion 48 is realized by the first engaging portion 32 comprising a surface 58 and the second engaging portion 48 comprising a second surface 60. These surfaces 58 and 60 are preferably arranged parallel with respect to each other and get in direct contact such that the second housing part 16 is held strongly on the first housing part 14.

It is further preferred that in the engaged state as shown in FIG. 6 a force acting on the engaging portions 32 and 48 as a result of any pull forces on the first and second housing parts 14 and 16 results in a force vector that is directed towards or goes through the pivot axis 54. In other words, the surfaces 58 and 60 are oriented in a way that an orthogonal vector of these surfaces 58 and 60 in the engaged state goes through or is directed towards the pivot axis 54 of the locking element 26. The last case can be regarded as identical to the afore-mentioned one, since a force acting on these engaging portions 32 and 48 could be represented by a vector that runs orthogonal to the surfaces 58 and 60 in the engaged state.

In order to achieve the disengaged state of the locking mechanism 24 the handle 56 has to be moved away from the second housing part 16, that is to say downwards with respect to the representation of FIGS. 6 and 7. This is illustrated in FIG. 6 by an arrow 62. Thereby, a turning around pivot axis 54 occurs and the first engaging portion 32, as well as all the other first engaging portions 28, 30 and 34, moves out of the fit connection with the second engaging portion 48, or second engaging portions 44, 46 and 50. With respect to the representation of FIGS. 6 and 7, the first engaging portion 32 moves to the left or, with respect to the housing 10, inward. The end state of this disengagement is shown by the representation of FIG. 7. In this disengaged state the second housing part 16 can be easily removed from the first housing part 14.

If the engaged or locked state shall be (re-)established the handle 56 is moved towards the second housing part 16 or with respect to the representation of FIGS. 6 and 7 upwards. This is indicated by an arrow 64. Thereby a rotation around pivot axis 54 occurs again such that the first engaging portions, like first engaging portion 32, are moved with respect to the housing 10 outwards or with respect to the representation of FIG. 7 to the right. Thereby, first engaging portion 32 gets (again) in a releasable fit connection with the second engaging portion 48.

In order to avoid unwanted movement of the handle 56 in either direction and therefore unwanted opening or closing of the first engaging portions 28, 30, 32 and 34, a holding mechanism 66 is further provided on the first housing part 14. In this special embodiment of the housing 10, the holding mechanism 66 is arranged on the attaching element 36. The holding mechanism 66 comprises a latching element 68, arranged on the attaching element 36, and a nose 70 arranged on handle 56. In both moving directions of the handle 56 illustrated by arrows 62 and 64 the nose 70 has to pass over the latching element 68. This latching element 68 is biased and can be bent such that the nose 70 may pass over this latching element 68. For this the latching element 68 bends towards the right with respect to the representation of FIGS. 6 and 7. Due to the bias of the latching element 68 the latter moves to its former position after the nose 70 has passed the latching element 68. The bias of the latching element 68 is chosen such that an unwanted movement of the handle 56 in either direction is avoided whereas a wanted movement by actuating the handle 56 can easily be achieved. Accordingly, this holding mechanism 66 further assists in the easy and fast opening and closing of the housing 10.

Figure 8:
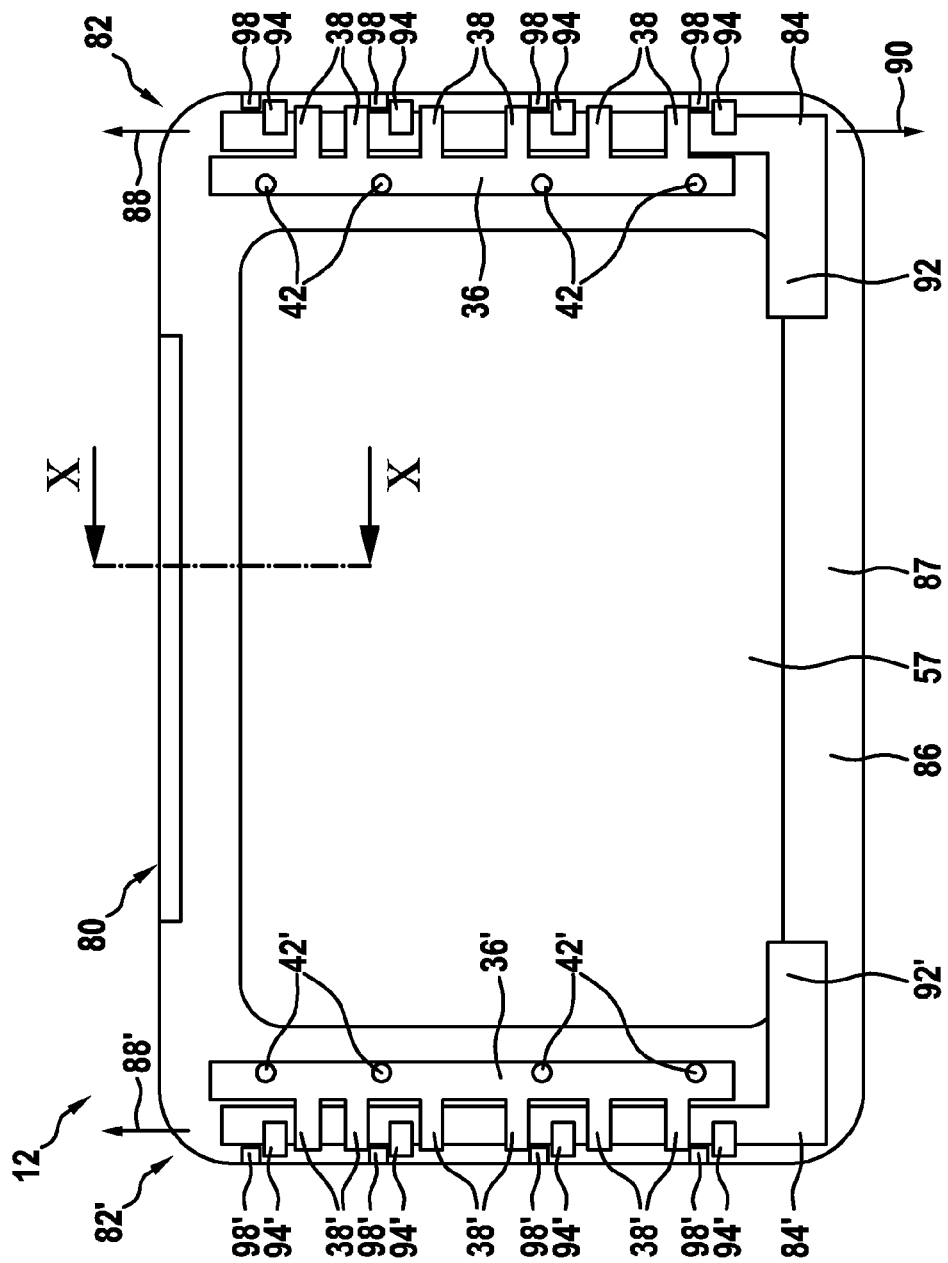
FIG. 8 shows a view of another embodiment of a housing similar to FIG. 3 with another embodiment of the locking mechanism in a disengaged state.
Figure 9:
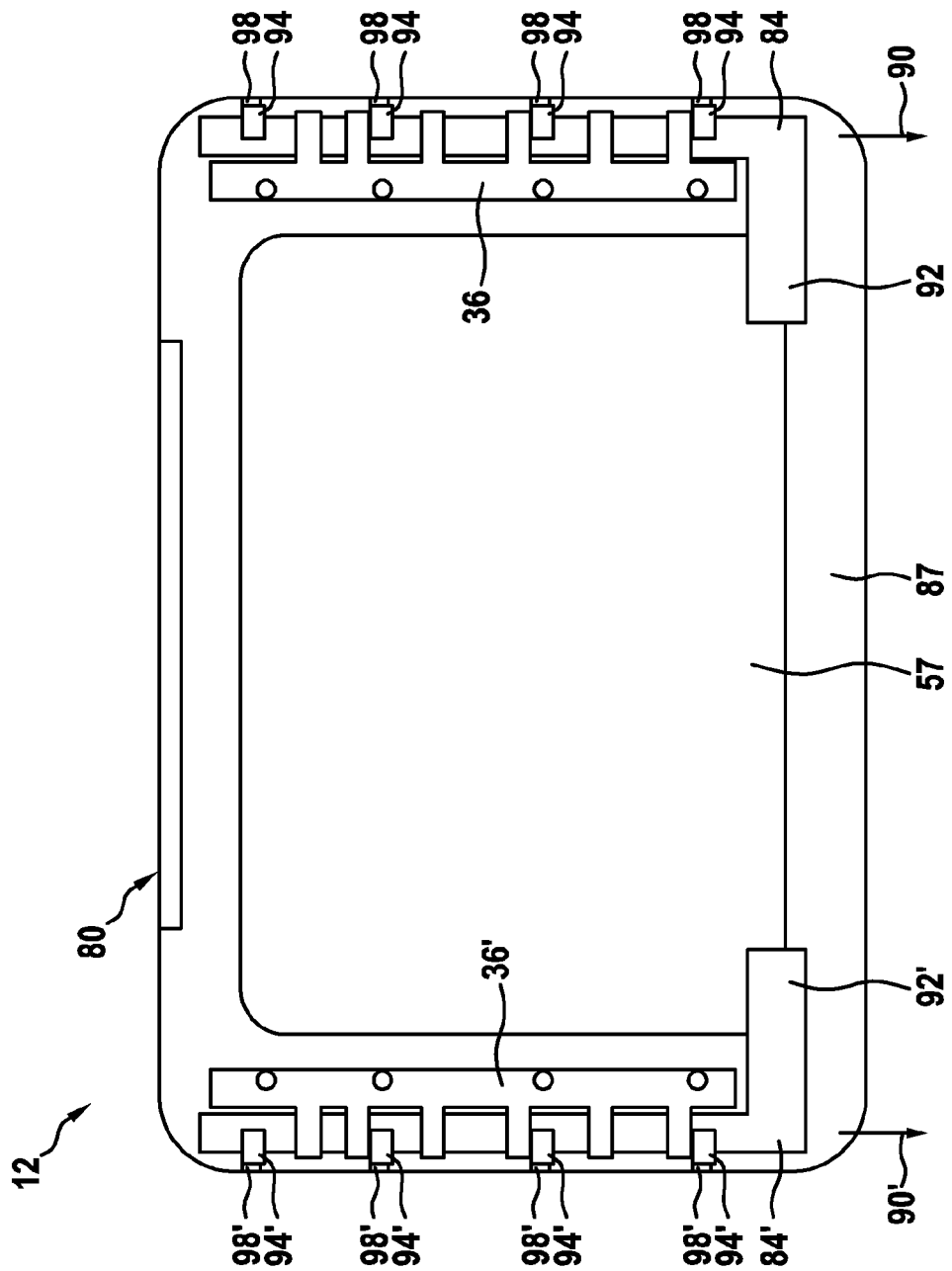
FIG. 9 shows the housing of FIG. 8 with the locking mechanism in an engaged state.

FIGS. 8 and 9 show another exemplary embodiment of a housing according to the present invention, the housing 12. Therein, parts identical to housing 10 are designated by the same reference numerals and are not further explained in more detail.

Figure 10:
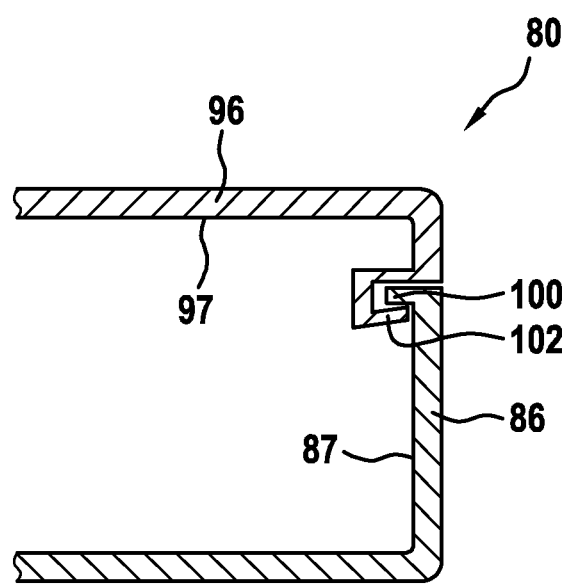
FIG. 10 shows an enlarged schematic sectional view according to a line X-X of FIG. 3.

As shown in the sectional view of FIG. 10, housing 12 comprises a first housing part 86 and a second housing part 96. First housing part 86 comprises a first inner wall 87, whereas second housing part 96 comprises a second inner wall 97. Further, now referring to FIG. 8, housing 12 comprises two types of locking mechanisms, locking mechanism 80 and locking mechanism 82. Whereas locking mechanism type 80 is brought into the locked or engaged state in the assembly process of joining the first housing part 86 and the second housing part 96, which will be explained later on in more detail, the second locking mechanism 82 is preferably actuated and brought into the locked or engaged state after the assembly of first housing part 86 and second housing part 96, similar to locking mechanism 24 of housing 10.

As also shown in FIG. 8 and also similar to housing 10, housing 12 comprises two locking mechanisms 82 and 82'. Again, those locking mechanisms 82 and 82' are comprised of the similar elements, such that the following explanations made for and in the context of locking mechanism 82 are correspondingly valid for the locking mechanism 82' shown in the respective figures. Correspondingly, the same reference numerals are used for identical features only altered by an added prime (') after a reference numeral for clarity reasons.

Further, as locking mechanism 24 locking mechanism 82 can be altered between an engaged and a disengaged state. For this, the locking mechanism 82 comprises a locking element 84. Locking element 84 is arranged on the first housing part 86 of housing 12 via an attaching element 36 in this example. It goes without saying that even though the same attaching element 36 is used in housing 12 for attaching the locking element 84 on the first housing part 86 any other attaching element or attaching method may be used that is suitable for attaching the locking element 84 movably on this first housing part 86. The choice of the attaching element basically depends on the shape and design of the respective locking element 84.

In housing 12 the locking element 84 is movable along a path that corresponds to the former pivot axis, i.e. longitudinally. In other words, the locking element 84 is able to undergo a translational movement. This is indicated by arrows 88 and 90 in FIG. 8 and also FIG. 9. For an easy actuation the locking element 84 comprises a handle 92. This handle 92 basically corresponds to handle 56 of locking element 26. Locking element 84 further comprises in this embodiment four first engaging portions 94.

Second housing part 96 (not specifically shown in FIGS. 8 and 9) comprises the second inner wall 97. On this inner wall 97 second engaging portions 98 are arranged.

FIG. 8 shows the disengaged state of first engaging portions 94 and second engaging portions 98. This means that first housing part 86 and second housing part 96 can easily be disassembled. In contrast to FIG. 8 FIG. 9 shows the engaged state. Therein first engaging portions 94 lie with respect to the present representation above the second engaging portions 98. Thereby a fit connection of the engaging portions 94 and 98 is achieved and a disassembly of first housing part 86 and second housing part 96 is not possible.

In order to achieve the engaged state as shown in FIG. 9 locking element 84 is moved in the direction of arrow 88. This can be done preferably by using handle 92. Thereby, first engaging portions 94 are moved correspondingly in this direction and engage with the corresponding second engaging portions 98.

The disengaged state as shown in FIG. 8 is achieved again by movement of the locking element 84 in the direction of arrow 90. This is preferably done again by using handle 92.

As a result, first engaging portions 94 and second engaging portions 98 get disengaged and a disassembly of housing 12 is possible.

The shape of the first engaging portions 94 and second engaging portions 98 may be for example identical to the shape of first engaging portions 28, 30, 32 and 34 and second engaging portions 44, 46, 48 and 50, respectively. However, any other suitable shape for these first and second engaging portions 94 and 98 may be chosen as long as a reliable locking of first and second housing part 86 and 96 is achieved.

FIG. 10 shows a simple representation of the locking mechanism 80 as already mentioned in the context of FIG. 8. This locking mechanism 80 comprises a tongue 100 forming a third engaging portion and a groove 102 forming a fourth engaging portion. In this special embodiment the tongue 100 is arranged on the first inner wall 87 of the first housing part 86 whereas the groove 102 is arranged on the second inner wall 97 of the second housing part 96. The locking state of this locking mechanism 80 is achieved by joining first housing part 86 and second housing part 96 in a way, possibly in a slightly angled way such that tongue 100 enters groove 102.

By such an arrangement with this locking mechanism 80 together with locking mechanism 82 as shown in FIGS. 8 through 10 an even distributed locking of the two housing parts 86 and 96 of housing 12 is achieved on three sides which leads to an evenly locked state and a reliable lock of the two housing parts 86 and 96.

Although only housing 12 is shown with another locking mechanism 80 aside from the actuatable locking mechanism 82 it goes without saying that also the embodiment of the locking mechanism shown for housing 10 in FIGS. 1 through 7 may be equipped with a locking mechanism identical or similar to locking mechanism 80. Further, aside from this static locking mechanism 80, housings may be provided with another actuatable locking mechanism, like locking mechanisms 24 and 82, instead of locking mechanism 80 or even with an actuatable locking mechanism present on every possible side of the housing.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

The invention claimed is:
1. A housing with
   at least one first housing part, having a first inner wall,
   at least one second housing part, having a second inner wall, and
   at least one locking element,
   wherein the at least one locking element is arranged moveably on the at least one first housing part along at least one path and comprises a plurality of first engaging portions arranged on the first inner wall, wherein the at least one second housing part comprises a plurality of second engaging portions on the second inner wall, wherein each one of the first engaging portions forms a releasable fit connection with one corresponding second engaging portion that can at least be changed between an engaged state and a disengaged state, wherein, in the engaged state, each of the first engaging portions are configured to latch onto the corresponding second engaging portion, and wherein the change between these at least two states is realized for all the first engaging portions on a locking element and the corresponding second engaging portions simultaneously by moving the respective locking element along the at least one path, wherein the at least one path leads to a rotational movement of the at least one locking element.

2. The housing of claim 1, wherein the housing comprises a plurality of locking elements.

3. The housing of claim 2, wherein the locking elements are arranged on opposing sides of the housing.

4. The housing of claim 1, wherein the housing comprises two to four of locking elements.

5. The housing of claim 1, wherein the housing comprises four locking elements.

6. The housing of claim 1, wherein the housing comprises three locking elements.

7. The housing of claim 1, wherein the housing comprises two locking elements.

8. The housing of claim 1, wherein the at least one locking element comprises a handle for moving the at least one locking element along the at least one path.

9. The housing of claim 8, further including a holding mechanism disposed on the at least one first housing part, the holding mechanism including:
a latching element disposed on the attaching element;
a nose disposed on the handle;
wherein, when the first and second engaging members are in the engaged state, the latching element is configured to contact a bottom surface of the handle.

10. The housing of claim 9, wherein, when the first and second engaging members are in the disengaged state, the latching element is configured to be biased to move past the nose and contact a side surface of the handle.

11. The housing of claim 1, further comprising
at least one third engaging portion on the first inner wall of said first housing part, and
at least one fourth engaging portion on the second inner wall of said second housing part,
wherein the at least one third engaging portion and the at least one fourth engaging portion form a releasable fit connection that is established by joining the first housing part with the second housing part.

12. The housing of claim 1, further including an attaching element with a plurality of holders attached thereto, the attaching element being configured to secure the locking element between the plurality of holders and the first inner wall.

13. The housing of claim 1, wherein each first engaging member includes a first surface, and each second engaging member includes a second surface,
wherein, in the disengaged state, each first surface is disposed parallel to a corresponding second surface, and, in the engaged state, each first surface is configured to contact the corresponding second surface.

14. A monitor device, comprising a display configured to display information, and a housing including:

at least one first housing part with a first inner wall;
at least one locking element arranged on the at least one first housing part, the at least one locking element includes a plurality of first latches disposed on the first inner wall;
at least one second housing part with a second inner wall, the at least one second housing part including a plurality of second latches disposed on the second inner wall;
wherein each one of the first latches is configured to latch on to a corresponding second latch upon rotation of the at least one locking element when the at least one first housing part is moved relative to the at least one second housing part.

15. A housing for a patient monitor, the housing comprising
at least one first housing part with a first inner wall;
at least one locking element arranged on the at least one first housing part, the at least one locking element includes a plurality of first latches disposed on the first inner wall;
at least one second housing part with a second inner wall, the at least one second housing part including a plurality of second latches disposed on the second inner wall;
wherein each one of the first latches is configured to latch on to a corresponding second latch upon rotation of the at least one locking element when the at least one first housing part is moved relative to the at least one second housing part.

16. The housing of claim 15, wherein the at least one locking element includes a handle configured to rotatably move the at least one locking element.

17. The housing of claim 16, further including a holding mechanism disposed on the at least one first housing part, the holding mechanism including:
a latching element disposed on the attaching element;
a nose disposed on the handle;
wherein, when the first and second latches are engaged, the latching element is configured to contact a bottom surface of the handle, and, when the first and second latches are engaged, the latching element is configured to be biased to move past the nose and contact a side surface of the handle.

18. The housing of claim 15, further comprising
at least one third latch disposed on the first inner wall of the first housing part, and
at least one fourth latch disposed on the second inner wall of the second housing part,
wherein the at least one third latch is configured to latch on to a corresponding fourth latch when the at least one first housing part is moved relative to the at least one second housing part.

19. The housing of claim 15, further including an attaching element with a plurality of holders attached thereto, the attaching element being configured to secure the locking element between the plurality of holders and the first inner wall.

20. The housing of claim 15, wherein each first latch includes a first surface, and each second latch includes a second surface,
wherein, when the first and second latches are not engaged, each first surface is disposed parallel to a corresponding second surface, and, when the first and second latches are engaged, each first surface is configured to contact the corresponding second surface.

* * * * *